United States Patent
Forbes

(10) Patent No.: US 7,198,999 B2
(45) Date of Patent: Apr. 3, 2007

(54) FLASH MEMORY DEVICE HAVING A GRADED COMPOSITION, HIGH DIELECTRIC CONSTANT GATE INSULATOR

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 16 days.

(21) Appl. No.: 11/213,104

(22) Filed: Aug. 26, 2005

(65) Prior Publication Data

US 2005/0282327 A1   Dec. 22, 2005

Related U.S. Application Data

(62) Division of application No. 10/835,221, filed on Apr. 29, 2004.

(51) Int. Cl.
H01L 21/8238 (2006.01)
(52) U.S. Cl. .................. 438/216; 257/E21.01
(58) Field of Classification Search ............... 438/211, 438/216, 403
See application file for complete search history.

(56) References Cited

U.S. PATENT DOCUMENTS

| | | | |
|---|---|---|---|
| 4,217,601 A * | 8/1980 | DeKeersmaecker et al. | 257/325 |
| 4,253,106 A * | 2/1981 | Goldsmith et al. | 257/318 |
| 5,101,249 A | 3/1992 | Hijiya et al. | |
| 5,801,401 A | 9/1998 | Forbes | |
| 5,852,306 A | 12/1998 | Forbes | |
| 5,891,798 A | 4/1999 | Doyle et al. | |
| 5,981,350 A | 11/1999 | Geusic et al. | |
| 6,025,627 A | 2/2000 | Forbes et al. | |
| 6,031,263 A | 2/2000 | Forbes | |
| 6,271,094 B1 | 8/2001 | Boyd et al. | |
| 6,291,866 B1 | 9/2001 | Wallace et al. | |
| 6,306,742 B1 | 10/2001 | Doyle et al. | |
| 6,495,890 B1 | 12/2002 | Ono | |
| 6,559,051 B1 | 5/2003 | Buynoski et al. | |
| 6,586,797 B2 | 7/2003 | Forbes et al. | |
| 6,717,226 B2 | 4/2004 | Hegde et al. | |
| 6,731,531 B1 | 5/2004 | Forbes et al. | |
| 6,762,068 B1 | 7/2004 | Forbes et al. | |
| 6,911,707 B2 | 6/2005 | Gardner et al. | |
| 2003/0048666 A1 | 3/2003 | Eldridge et al. | |
| 2003/0049900 A1 * | 3/2003 | Forbes et al. | 438/201 |
| 2003/0207032 A1 | 11/2003 | Ahn et al. | |
| 2003/0207540 A1 | 11/2003 | Ahn et al. | |
| 2005/0098839 A1 * | 5/2005 | Lee et al. | 257/410 |
| 2005/0138262 A1 | 6/2005 | Forbes | |
| 2005/0173755 A1 | 8/2005 | Forbes | |
| 2005/0199944 A1 | 9/2005 | Chen et al. | |

OTHER PUBLICATIONS

P. Pavan, et al. "Flash Memory Cells-An Overview" Proceedings of the IEEE, vol. 85, No. 8, Aug. 1997 pp. 1248-1271.

* cited by examiner

Primary Examiner—W. David Coleman
(74) Attorney, Agent, or Firm—Leffert, Jay & Polglaze P.A.

(57) ABSTRACT

A graded composition, high dielectric constant gate insulator is deposited between a substrate and floating gate in a flash memory cell transistor. If the composition of the gate insulator is closer to the high-k material near the substrate, the electron barrier for hot electron injection will be lower. If the gate insulator is closer to the high-k material near the floating gate, the tunnel barrier can be lower at the floating gate.

20 Claims, 4 Drawing Sheets

FLASH MEMORY DEVICE HAVING A GRADED COMPOSITION, HIGH DIELECTRIC CONSTANT GATE INSULATOR

RELATED APPLICATION

This Application is a Divisional of U.S. application Ser. No.10/835,221, titled "FLASH MEMORY DEVICE HAVING A GRADED COMPOSITION, HIGH DIELECTRIC CONSTATE GATE INSULATOR," filed Apr. 29, 2004, (pending) which is commonly assigned and incorporated herein by reference.

TECHNICAL FIELD OF THE INVENTION

The present invention relates generally to memory devices and in particular the present invention relates to flash memory devices with graded composition gate insulators.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Flash memory cells are typically comprised of field effect transistors (FET) with floating gates. The gates are referred to as floating since they are electrically isolated from other conductive areas of the transistor by layers of oxide insulation. The floating gate can be programmed or erased by Fowler-Nordheim tunneling in which electrons tunnel through a barrier in the presence of a high electric field in the oxide.

One drawback with floating gate FETs is the large amount of time needed to store a charge on the floating gate during a write operation and the large amount of time necessary to remove the charge during an erase operation. One reason for the inordinate time requirements is the relatively large tunneling barrier between the silicon substrate and the silicon dioxide insulator. Additionally, the high electric field required to cause electron injection in order to tunnel through the barrier typically contributes to reliability problems and premature gate insulator breakdowns.

Silicon dioxide ($SiO_2$) is an insulator with a relative dielectric constant of 3.9, an energy gap of approximately $E_g=9$ eV, and electron affinity of $\chi=0.9$ eV. By comparison, the energy gap and electron affinity for the semiconductor silicon are $E_g=1.1$ eV and $\chi=4.1$ eV, respectively. In a conventional flash memory cell, electrons stored on the polysilicon floating gate see a large tunneling barrier of about 3.2 eV. FIG. 1 illustrates the typical prior art large barrier, $\Phi=3.2$ eV, for tunneling erase in flash memory devices. The large tunneling barrier $\Phi=3.2$ eV is the difference between the electron affinities of silicon (i.e., $\chi=4.1$ eV) and $SiO_2$ (i.e., $\chi=0.9$ eV). This is a relatively large barrier that requires a high applied electric field.

There is a resulting need in the art for an improved gate insulator that provides a low tunneling barrier in order to decrease the time required for programming and erase operations in a flash memory cell.

SUMMARY

The above-mentioned problems with gate insulators in flash memory cells and other problems are addressed by the present invention and will be understood by reading and studying the following specification.

The present invention encompasses a flash memory transistor comprising a substrate with a plurality of source/drain regions. The source/drain regions have a different conductivity than the remainder of the substrate.

A graded composition, high dielectric constant gate insulator is formed on top of the substrate. The gate insulator is formed substantially between the plurality of source/drain regions over a channel region between the source/drain regions. The gate insulator has a dielectric constant that is greater than 3.9. In one embodiment, the gate insulator is comprised of more of a high-k material closer to the substrate. In another embodiment, the gate insulator is comprised of more of a high-k material closer to a floating gate that is formed on top of the gate insulator.

An oxide insulator is formed on top of the floating gate. A control gate is formed on top of the oxide insulator.

Further embodiments of the invention include methods and apparatus of varying scope.

DETAILED DESCRIPTION

Figure 1:
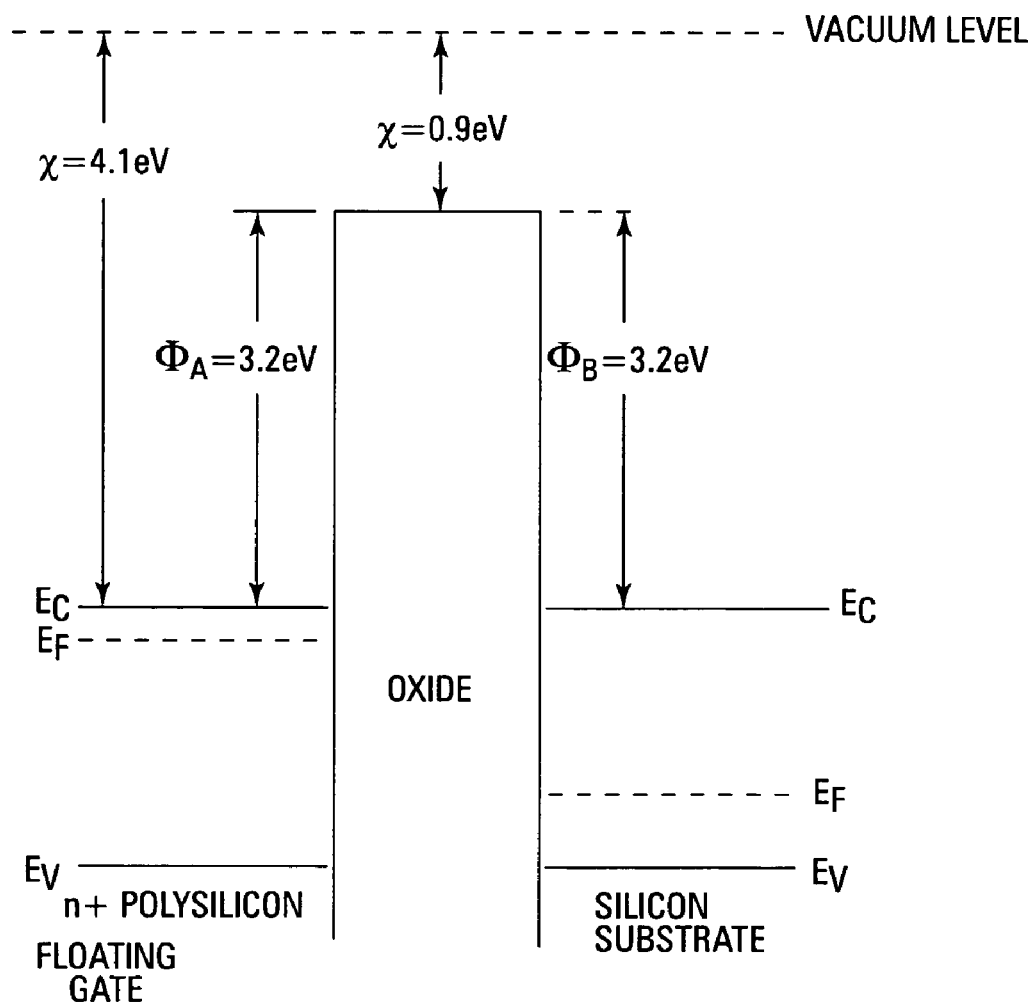
FIG. 1 shows a typical prior art electron energy diagram for a flash memory cell.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 2:
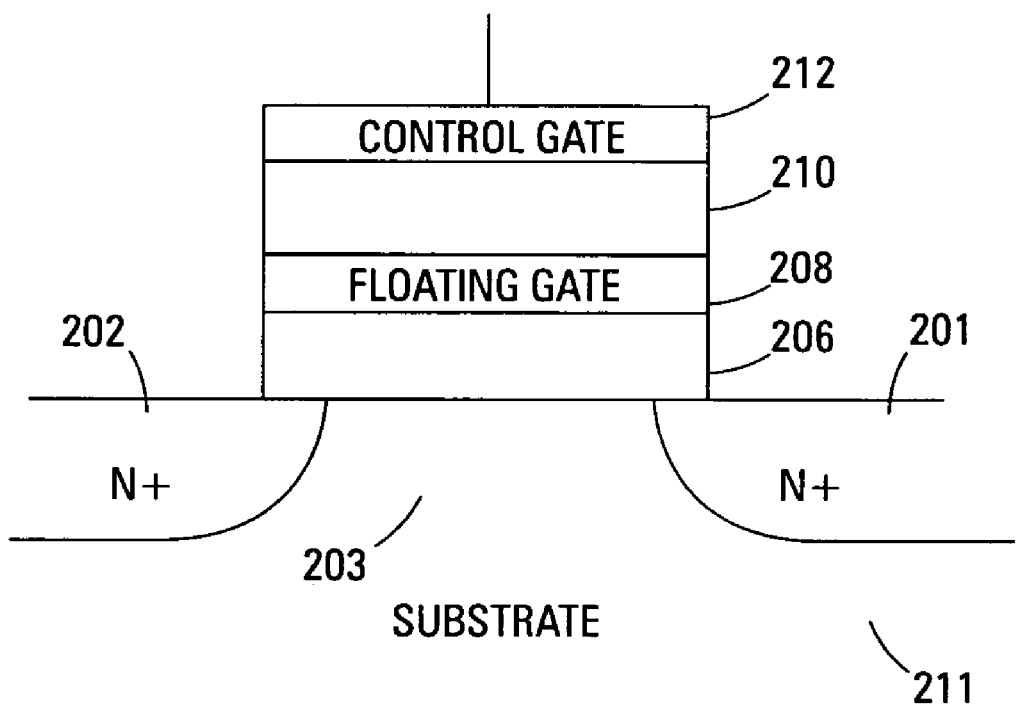
FIG. 2 shows a cross-sectional view of one embodiment of a flash memory cell transistor of the present invention having a graded composition, high dielectric constant gate insulator.

FIG. 2 illustrates a cross-sectional view of one embodiment of a flash memory cell transistor of the present invention. The transistor has a graded composition, high dielectric constant (i.e., high-k) gate dielectric. The transistor is comprised of two source/drain regions 201 and 202 in a silicon substrate 211. The direction of operation of the transistor determines which region 201 or 202 functions as a source and which functions as a drain. A channel region 203 exists between the source/drain regions 201 and 202.

In one embodiment, the source/drain regions 201 and 202 are n+ doped regions in a p+ type substrate 211. An alternate embodiment may use p+ doped source/drain regions in an n+ type substrate. The present invention is not limited to any one conductivity type for the source/drain regions or the substrate.

A high-permittivity (high-k), graded composition tunnel gate dielectric 206 is formed on top of the substrate 211 substantially between the source/drain regions 201 and 202 and over the channel region 203. A polysilicon floating gate layer 208 is formed on top of the tunnel gate dielectric layer 206. An interpoly oxide insulator layer 210 is formed on top of the floating gate 208. A polysilicon control gate 212 is formed on top of the oxide insulator 210.

In one embodiment, a high dielectric constant is considered to be a dielectric constant that is greater than that of $SiO_2$. A wide variety of different high dielectric constant insulators can be realized using atomic layer deposition (ALD) or evaporation techniques. These dielectric materials and their characteristics are summarized in the following table:

| Material | Dielectric Constant (k) | Band Gap $E_c$ (eV) | Delta $E_c$ (eV) to Si |
|---|---|---|---|
| $SiO_2$ | 3.9 | 8.9 | 3.2 |
| $Si_3N_4$ | 7 | 5.1 | 2 |
| $Al_2O_3$ | 9 | 8.7 | 2.8 |
| $Y_2O_3$ | 15 | 5.6 | 2.3 |
| $La_2O_3$ | 30 | 4.3 | 2.3 |
| $Ta_2O_5$ | 26 | 4.5 | 1–1.5 |
| $TiO_2$ | 80 | 3.5 | 1.2 |
| $HfO_2$ | 25 | 5.7 | 1.5 |
| $ZrO_2$ | 25 | 7.8 | 1.4 |

Alternate embodiments use other dielectrics than those listed above that have other dielectric constants. The characteristics of these materials are well known to those skilled in the art and are not discussed further.

Figure 3:
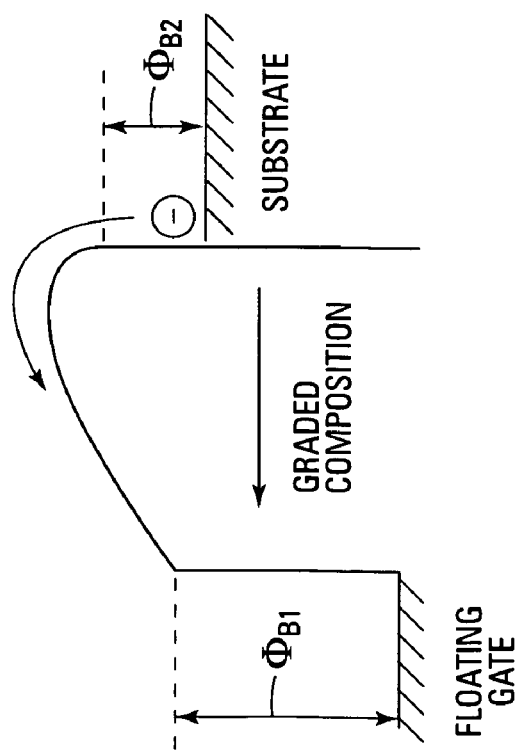
FIG. 3 shows one embodiment of an electron energy band diagram in accordance with the graded composition, high dielectric constant gate insulator transistor structure of FIG. 2.

The high-k dielectric materials of the present invention can be used as graded composition in either the tunnel gate dielectric 206 or the interpoly oxide insulator layer 210. By varying the composition ratios of these high-k dielectrics, the barriers and/or tunnel barriers can either be reduced between the silicon and the gate dielectric or between the floating gate and the gate insulating dielectric. This is illustrated in FIGS. 3 and 4 as discussed subsequently.

The composition of the film can be changed by varying the ratio of the metals in the film as described subsequently. FIG. 3 illustrates that if the composition is closer to $La_2O_3$ near the substrate, the electron barrier for hot electron injection will only be 2.3 eV. The tunnel barrier from the floating gate can be kept higher (i.e., approximately 2.8 eV) by making the insulator composition close to $Al_2O_3$ at the floating gate.

Figure 4:
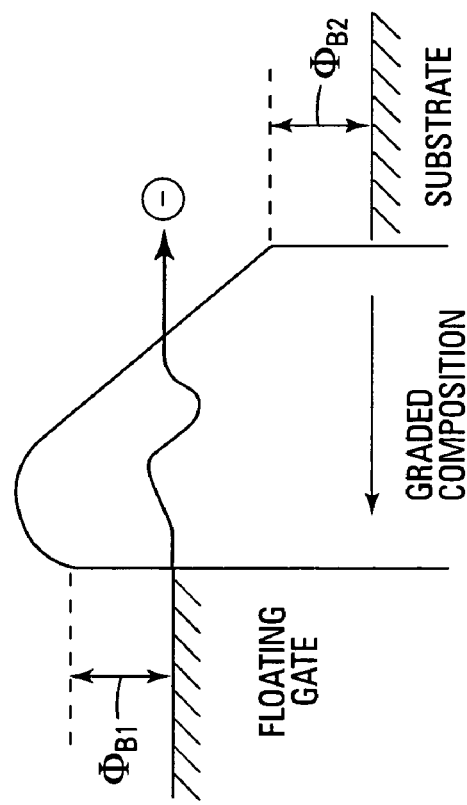
FIG. 4 shows another embodiment of an electron energy band diagram in accordance with the graded composition, high dielectric constant gate insulator transistor structure of FIG. 2.

FIG. 4 illustrates that if the composition is closer to $Al_2O_3$ near the substrate, the electron barrier for hot electron injection will be 2.8 eV. The tunnel barrier from the floating gate can be kept lower (i.e., approximately 2.3 eV) by making the insulator composition close to $La_2O_3$ at the floating gate. Other realizations of graded composition, high-k dielectric gate insulators are also discussed subsequently.

One embodiment of the graded composition, high-k dielectric gate insulator of the present invention is comprised of a lanthanum aluminate ($LaAlO_3$) film. These films may be deposited on silicon substrates by evaporating single-crystal pellets in a vacuum using an electron-beam gun. In another embodiment, the films can sue a dry pellet of $Al_2O_3$ and $La_2O_3$ using two electron guns with two rate monitors that are set to control the composition. The composition of the film can be shifted toward $Al_2O_3$ or $La_2O_3$ side by depending upon the choice of electron affinity. After deposition, the wafer can be annealed ex situ in an electric furnace at 700° C. for ten minutes in $N_2$ ambience or 800–900° C. in RTA for ten to fifteen seconds in an $N_2$ ambience. Alternate embodiments may use other deposition and/or annealing methods.

In another embodiment, the graded composition, high-k dielectric gate insulator of the present invention is comprised of Hf or Zr films. These films can be deposited by simple thermal evaporation that, in one embodiment, uses twin electron-beam evaporation with ultra-high purity Hf and Zr metal slugs (e.g., 99.9999%) at a low substrate temperature (e.g., 150°–200° C.). The second step is oxidation to form the desired $HfO_2$ or $ZrO_2$.

In yet another embodiment, very thin films of $TiO_2$ can be fabricated with electron-gun evaporation from a high purity $TiO_2$ slug (e.g., 99.9999%) in a vacuum evaporator in the presence of anion beam. In this embodiment, an electron gun is centrally located toward the bottom of the chamber. A heat reflector and a heater surround the substrate holder. Under the substrate holder is an ozonizer ring with many small holes directed to the wafer for uniform distribution of ozone that is needed to compensate for the loss of oxygen in the evaporated $TiO_2$ film. An ion gun with a fairly large diameter (3–4 in. in diameter) is located above the electron gun and argon gas is used to generate Ar ions to bombard the substrate surface uniformly during the film deposition to compact the growing $TiO_2$ film.

In still another embodiment, a thin Zr film is deposited by simple thermal evaporation. In one embodiment, this is accomplished by electron beam evaporation using an ultra-high purity Zr metal slug (e.g., 99.9999%) at a low substrate temperature (e.g., 150°–200° C.). Since there is no plasma and ion bombardment of the substrate, the original atomically smooth surface of the silicon substrate is maintained. The second step is the oxidation to form the desired $ZrO_2$.

The above-described evaporation techniques avoid the damage to the silicon surface by Ar ion bombardment, such as that encountered during Hf or Zr metal deposition using dc sputtering. Since there is no plasma and ion bombardment of the substrate (as in the case of sputtering), the original atomically smooth surface of the silicon substrate is maintained.

The fabrication of $Y_2O_3$ and $Gd_2O_3$ films for use as graded composition, high-k dielectric gate insulators may be accomplished with a two step process. In one embodiment, an electron gun provides evaporation of high purity (e.g., 99.9999%) Y or Gd metal followed by low-temperature oxidation technology by microwave excitation in a $Kr/O_2$ mixed high-density plasma at 400° C. The method of the present invention avoids damage to the silicon surface by Ar ion bombardment such as that encountered during Y or Gd metal deposition sputtering.

A thin film of Y or Gd is deposited by thermal evaporation. In one embodiment, an electron-beam evaporation technique is used with an ultra-high purity Y or Gd metal slug at a low substrate temperature (e.g., 150°–200° C.). Since there is no plasma or ion bombardment of the substrate, the original atomically smooth surface of the silicon substrate is maintained. The second step is the oxidation to form the desired $Y_2O_3$ or $Gd_2O_3$.

The use of the gate insulators described above allows for two different barriers. The lower height of the tunneling barriers with high-k dielectric gate insulators can provide larger tunneling currents out of the floating gate with smaller control gate voltages. The lower barrier between the silicon substrate makes the write operation easier and write currents by channel hot electron injection larger at lower voltages. Both tunneling currents and hot electron injection currents are exponential functions of the barrier heights and electric fields.

Figure 5:
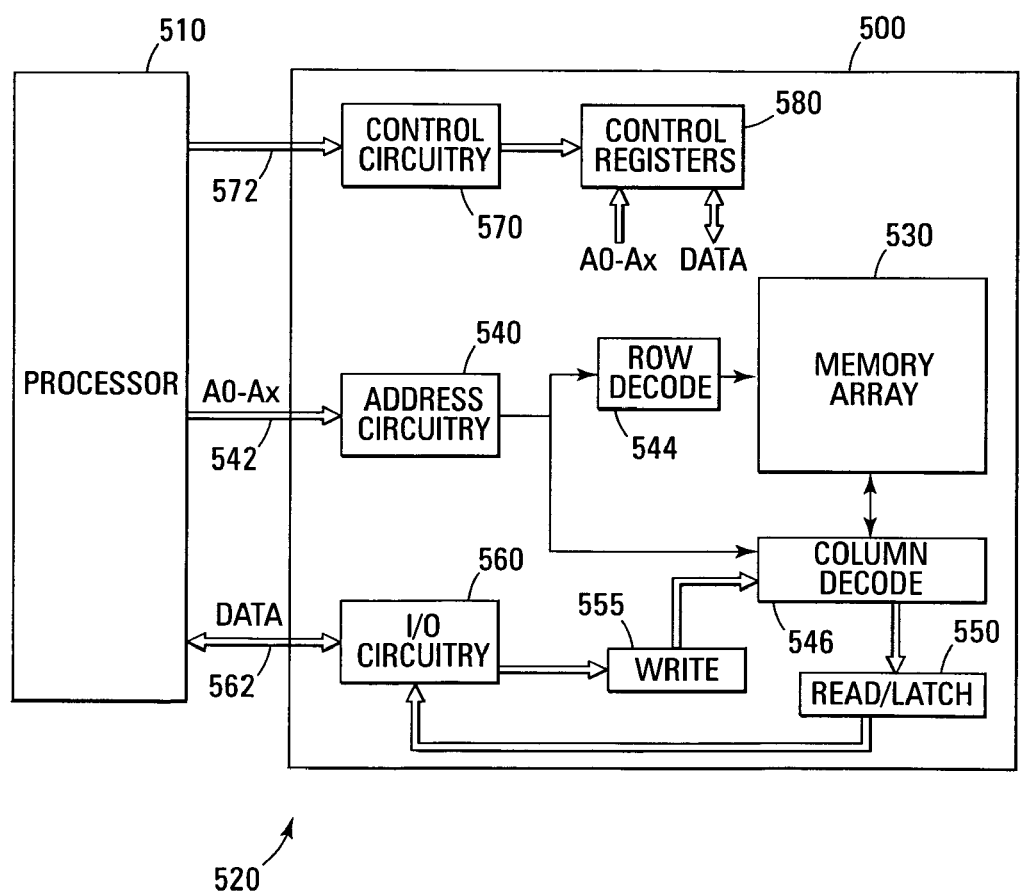
FIG. 5 shows a block diagram of an electronic system of the present invention.

FIG. 5 illustrates a functional block diagram of a memory device 500 that can incorporate the flash memory cells of the present invention. The memory device 500 is coupled to a processor 510. The processor 510 may be a microprocessor or some other type of controlling circuitry. The memory device 500 and the processor 510 form part of an electronic system 520. The memory device 500 has been simplified to focus on features of the memory that are helpful in understanding the present invention.

The memory device includes an array of flash memory cells 530. The memory array 530 is arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture or a NOR architecture.

An address buffer circuit 540 is provided to latch address signals provided on address input connections A0–Ax 542. Address signals are received and decoded by a row decoder 544 and a column decoder 546 to access the memory array 530. It will be appreciated by those skilled in the art, with the benefit of the present description, that the number of address input connections depends on the density and architecture of the memory array 530. That is, the number of addresses increases with both increased memory cell counts and increased bank and block counts.

The memory device 500 reads data in the memory array 530 by sensing voltage or current changes in the memory array columns using sense/buffer circuitry 550. The sense/buffer circuitry, in one embodiment, is coupled to read and latch a row of data from the memory array 530. Data input and output buffer circuitry 560 is included for bi-directional data communication over a plurality of data connections 562 with the controller 510). Write circuitry 555 is provided to write data to the memory array.

Control circuitry 570 decodes signals provided on control connections 572 from the processor 510. These signals are used to control the operations on the memory array 530, including data read, data write, and erase operations. The control circuitry 570 may be a state machine, a sequencer, or some other type of controller.

The flash memory device illustrated in FIG. 5 has been simplified to facilitate a basic understanding of the features of the memory. A more detailed understanding of internal circuitry and functions of flash memories are known to those skilled in the art.

CONCLUSION

In summary, the flash memory transistors of the present invention with graded composition, high-k gate dielectrics reduce the electron barrier between the substrate and gate insulator and the tunnel barrier between the polysilicon floating gate and gate insulator. This is accomplished by using a graded composition, high-k dielectric gate insulator instead of the prior art's silicon dioxide.

The higher dielectric constant gate insulators of the present invention also allow for better scaling of flash memory devices to smaller dimensions. The effective gate length of high-k gate tunneling dielectric flash memory transistors can be scaled below 50 nm. High-k gate dielectrics reduce or eliminate drain turn-on problems, short-channel effects and punchthrough in flash memory transistors. Smaller write and erase voltages provide another advantage in that the thickness of the $SiO_2$ layer between the control gate and the floating gate can be reduced.

The flash memory cells of the present invention may be NAND-type cells, NOR-type cells, or any other type of flash memory array architecture.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for fabricating a flash memory cell transistor, the method comprising:
    creating a plurality of source/drain regions by doping portions of a substrate;
    forming a graded composition, high-k tunnel insulator on the substrate substantially between the plurality of source/drain regions, the tunnel insulator having a dielectric constant that is greater than 3.9;
    forming a floating gate on the gate insulator;
    forming an oxide insulator material on the floating gate; and
    forming a control gate on the oxide insulator material.

2. The method of claim 1 wherein the evaporation technique comprises evaporation from a high purity $TiO_2$ slug in a vacuum evaporator with an ion beam.

3. The method of claim 1 wherein a portion of the gate insulator adjacent the substrate comprises more of the high-k dielectric material than remaining portions of the gate insulator.

4. The method of claim 1 wherein a portion of the gate insulator adjacent the floating gate comprises more of the high-k dielectric material than remaining portions of the gate insulator.

5. The method of claim 1 wherein the evaporation technique comprises electron-beam evaporation from a high purity Hf metal slug with a substrate temperature less than 200° C. and subsequent oxidizing.

6. The method of claim 1 wherein the evaporation technique on the high-k dielectric material is performed by electron-beam evaporation.

7. The method of claim 1 wherein the evaporation technique comprises depositing a Zr film on the substrate by thermal evaporation and subsequently oxidizing the Zr film.

8. The method of claim 1 wherein the evaporation technique comprises depositing one of a Y or a Gd film on the substrate by thermal evaporation and subsequently oxidizing the film.

9. The method of claim 1 wherein the evaporation technique comprises depositing a $LaAlO_3$ film on the substrate and subsequently annealing.

10. The method of claim 8 wherein the depositing one of the Y or the Gd film comprises electron-beam evaporation of a high purity Y or Gd metal slug at a substrate temperature less than 200° C.

11. The method of claim 9 wherein depositing the $LaAlO_3$ film comprises evaporation of $Al_2O_3$ and $La_2O_3$ using an electron gun for each material and the annealing is performed at 700° C. in an $N_2$ ambience.

12. The method of claim 9 wherein the annealing is performed at 800–900° C. in RTA for a time in a range of 10–15 seconds in an $N_2$ ambience.

13. A method for fabricating a flash memory cell transistor, the method comprising:
    doping first and second source/drain regions into a substrate;
    forming a graded composition, high-k tunnel insulator over the substrate and substantially between the first and second source/drain regions, the tunnel insulator comprising one of $Si_3N_4$, $Al_2O_3$, $Y_2O_3$, $La_2O_3$, $Ta_2O_5$, $TiO_2$, $LaAlO_3$, $HfO_2$, or $ZrO_2$ wherein the ratio of metal changes throughout the insulator;
    forming a floating gate on the gate insulator;
    forming an insulator layer on the floating gate; and
    forming a control gate over the insulator layer.

14. The method of claim 13 wherein the ratio of metal increases closer to the floating gate.

15. The method of claim 13 wherein the tunnel barrier from the floating gate is increased in response to a higher ratio of metal nearer to the floating gate than the substrate.

16. A method for fabricating a memory device having a plurality of memory cells, the method comprising:
    doping a pair of source/drain regions into a substrate for each of the plurality of memory cells;
    forming a graded composition, high-k tunnel insulator over the substrate substantially between each pair of source/drain regions, the tunnel insulator comprising one of $Si_3N_4$, $Al_2O_3$, $Y_2O_3$, $La_2O_3$, $Ta_2O_5$, $TiO_2$, $LaAlO_3$, $HfO_2$, or $ZrO_2$ wherein the ratio of metal decreases closer to the substrate;
    forming a floating gate on the gate insulator;
    forming an insulator layer on the floating gate; and
    forming a gate over the insulator layer.

17. The method of claim 16 wherein the first and second source/drain regions are n+regions and the substrate is a p-type silicon.

18. The method of claim 16 wherein the composition of the tunnel insulator is graded such that the electron barrier for hot electron injection is less than 3.2 eV.

19. The method of claim 16 wherein the gate is a polysilicon control gate.

20. The method of claim 16 wherein the insulator layer is an interpoly oxide insulator material.

* * * * *